United States Patent [19]

Ito

[11] Patent Number: 4,538,143
[45] Date of Patent: Aug. 27, 1985

[54] LIGHT-EMITTING DIODE DISPLAYER

[75] Inventor: Tsukasa Ito, Tokyo, Japan

[73] Assignee: Clarion Co., Ltd., Japan

[21] Appl. No.: 390,186

[22] Filed: Jun. 21, 1982

[30] Foreign Application Priority Data

Jun. 24, 1981 [JP] Japan .................. 56-92414[U]

[51] Int. Cl.³ .............................................. G09G 3/14
[52] U.S. Cl. .................................... 340/719; 340/718; 361/414
[58] Field of Search ............... 340/718, 719, 762, 782, 340/815.03; 313/510, 500; 361/400, 409, 410, 411, 414; 29/854, 860, 843, 831, 832, 840, 830

[56] References Cited

U.S. PATENT DOCUMENTS

| 3,760,091 | 9/1973 | Cannizzaro et al. | 361/414 |
| 4,150,421 | 4/1979 | Nishihara et al. | 361/414 |
| 4,204,205 | 5/1980 | Yagi et al. | 340/719 |
| 4,373,259 | 2/1983 | Motsch | 29/840 |
| 4,438,561 | 3/1984 | Mueller | 29/831 |

Primary Examiner—Gerald L. Brigance
Attorney, Agent, or Firm—Russell E. Hattis

[57] ABSTRACT

A light-emitting diode displayer in which a substrate and a film-like substrate are adhered to each other and are electrically connected to each other by silver paste.

2 Claims, 5 Drawing Figures

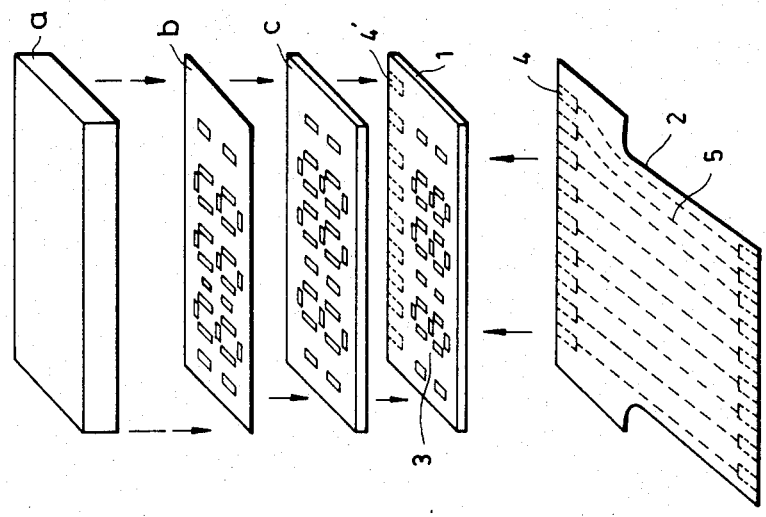
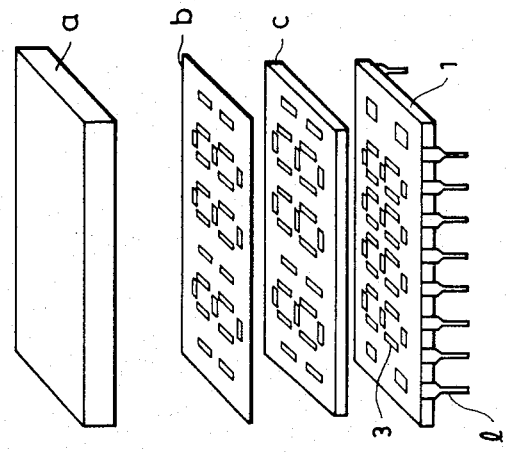

LIGHT-EMITTING DIODE DISPLAYER

BACKGROUND OF THE INVENTION

The present invention relates to a structure of a light-emitting diode (LED) displayer.

Conventionally, light-emitting diode displayers have been manufactured in following manners and had the following structures:

(1) One of them is, as shown in FIG. 1, to provide an electric circuit and an LED connection pad on substrate 1 to which a lead wires 1 are connected, next to connect an LED chip 3 to the LED connection pad and finally, mount reflector c, a letter panel b, a filter a, etc., thus finishing a displayer; and (2) The other is, as shown in FIG. 2, to adhere on the substrate 1 a film-like substrate 2 having a conductor pattern 5 and connection electrodes 4 instead of providing lead wires 1, and to solder the connection electrodes 4 on associated soldering lands 4' of the substrate 1.

However, the displayer arranged as in (1) is disadvantageous because the lead wires 1 on the substrate 1 prevent the displayer from being made compact and thin and that as described in (2) causes high production cost because the film-like substrate 2 to be soldered on the substrate 1 has to be made of a material with adequately heat-proof properties.

SUMMARY OF THE INVENTION

It is therefore an object of the present invention provide a light-emitting diode displayer having a structure free from the above-mentioned drawbacks.

In accordance with the present invention, there is provided a light-emitting diode displayer which comprises:

an LED substrate on which a plurality of LED chips are provided;

a film-like substrate to be adhered on said LED substrate;

said LED substrate having holes formed therein for electrical connection of said LED chips while said film has conductor pattern formed thereon and holes so formed therein to be associated in said holes of said LED substrate, and, each associated ones of said holes being filled with silver paste to electrically connect said both substrates to each other.

BRIEF DESCRIPTION OF THE DRAWINGS

FIGS. 1 and 2 are perspective views showing components of conventional displayers;

DETAILED DESCRIPTION OF THE PREFERRED EMBODIMENT

Figure 3:
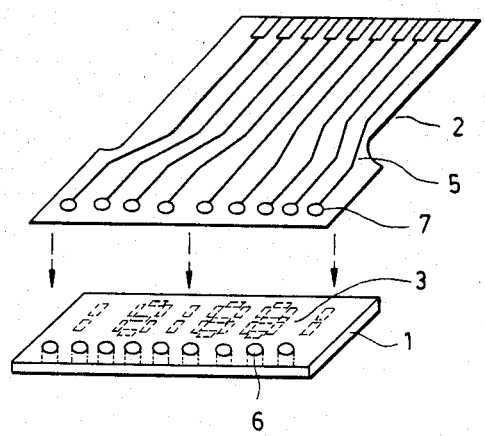
FIG. 3 is a perspective view of the substrate and the film-like substrate both being adhered to each other, in an embodiment according to the present invention.

The present invention will now be described in detail referring to the preferred embodiment illustrated in the drawings.

In the embodiment as shown in FIG. 3, the substrate 1 and the film-like substrate 2 are adhered to each other by an adhesive bond spread on the back (lower) surface of the film-like substrate 2. The substrate 1 is provided with LED chips 3 affixed to the lower surface thereof while the film-like substrate 2 has a conductor pattern formed thereon. The reflector, the letter panel, the filter, etc. which are provided as in the prior art are not shown here.

Particularly in the present invention, a plurality of holes 6 in metallizations 9 electrically connected to the LED chips 3 are formed in the substrate 1 while a plurality of holes 7 each associated with the hole 6 and electrically connected to the conductor pattern 5 are formed in the film-like substrate 2. The substrate 1 and the film-like substrate 2 are electrically connected to each other through those holes 6 and 7.

Figure 4:
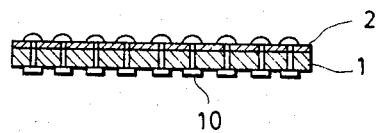
FIG. 4 is a sectional view of FIG. 3 in electrically connected condition.

FIG. 4 shows a sectional view of the displayer as shown in FIG. 3 wherein the holes 6 of the substrate 1 and the associated holes 7 of the film-like substrate 2 are electrically connected to each other.

Figure 5:
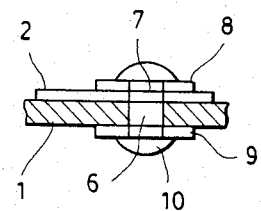
FIG. 5 is a partially enlarged view of FIG. 4.

FIG. 5 is a partial enlargement of FIG. 4 wherein the substrate 1 and the film-like substrate 2 are electrically connected to each other by filling the holes 6 and 7 with conductive silver paste 10. In this case, such connection can be improved by providing copper films 8 and 9 with holes surrounding the holes 6 and 7 and having the silver paste 10 terminate at the copper films 8 and 9.

The film-like substrate 2 which need not be soldered permits use of cheap polyester resin instead of expensive polyimide with high heat-proof properties.

According to the present invention as constructed as above, it is possible to make a displayer compact and thin and to reduce the production cost.

I claim:

1. A light-emitting diode displayer which comprises:
   an LED substrate having opposite major surfaces on a first surface of which a plurality of LED chips are provided;
   a film-like substrate having opposing major surfaces and adhered on the opposite surface of said LED substrate;
   said LED substrate having conductive paths on said first surface electrically connected to said LED chips and having holes formed therein communicating between said major faces and intersecting portions of said paths, said film-like substrate having a conductive pattern of paths formed on one major surface thereof and holes so formed therein aligned with said holes of said LED substrate and intersecting portions of said conductive pattern, each aligned pair of said holes being filled with conductive paste self-curing to a hardened form to electrically connect the conductive paths of said substrates to each other.

2. A light-emitting diode displayer of claim 1 wherein said conductive paths with holes are provided on non-interfacially touching surfaces of said LED substrate and said film-like substrate, and said conductive paste terminates generally at said conductive films.

* * * * *